United States Patent [19]
Shirota et al.

[11] Patent Number: 5,487,953
[45] Date of Patent: Jan. 30, 1996

[54] ORGANIC ELECTROLUMINESCENT DEVICE

[75] Inventors: Yasuhiro Shirota, Toyonaka; Hiroshi Inada, Kobe; Yoshinobu Yonemoto, Tsurugashima; Takeo Wakimoto, Tsurugashima; Kunio Imai, Tsurugashima, all of Japan

[73] Assignees: Pioneer Electronic Corporation, Tokyo; Bando Chemical Industries, Ltd., Kobe, both of Japan

[21] Appl. No.: 309,538

[22] Filed: Sep. 20, 1994

[30] Foreign Application Priority Data

Sep. 22, 1993 [JP] Japan .................................. 5-236729

[51] Int. Cl.⁶ .............................. H05B 33/20; H01J 1/62
[52] U.S. Cl. .......................... 428/690; 428/917; 313/503; 313/504; 313/505; 313/506; 313/507; 313/508; 313/509

[58] Field of Search ..................................... 428/690, 691, 428/917; 313/503–509

[56] References Cited

U.S. PATENT DOCUMENTS 5,256,945  10/1993  Imai et al. ............................. 313/504
5,374,489  12/1994  Imai et al. ............................. 428/690

*Primary Examiner*—Charles R. Nold
*Attorney, Agent, or Firm*—Foley & Lardner

[57] ABSTRACT

An organic electroluminescent device comprises an organic emitting layer and a hole transport layer laminated with each other and arranged between a cathode and an anode, in characterized in that the hole transport layer made of the triphenylbenzene derivative. This hole transport layer has the high heart-resistant property and high conductivity to improve the durability and thus this device emits light at a high luminance and a high efficiency upon application of a low voltage.

2 Claims, 2 Drawing Sheets

EMISSION

EMISSION

EMISSION

ORGANIC ELECTROLUMINESCENT DEVICE

BACKGROUND OF THE INVENTION

1. Field of the invention

The present invention relates to an electroluminescent device (hereinafter referred as "EL device") having an emitting layer made of an emitting substance, which utilizes an electroluminescence phenomenon that the emitting substance emits light by applying an electric current to the emitting layer. More particularly, it is concerned with an organic EL device in which the emitting layer is made of an organic emitting substance.

2. Description of the prior art

As prior art organic EL devices, there have been known an device of two-layer structure having two layers of organic compounds as shown in FIG. 1, in which an organic fluorescent thin film 3 (hereinafter referred as "emitting layer") and an organic hole transport layer 4 are laminated with each other and are arranged between a metal cathode 1 and a transparent anode 2. There have been also known an device of three-layer structure having three layers of organic compounds as shown in FIG. 2, in which an organic electron transport layer 5, an emitting layer and an organic hole transport layer 4 are laminated in sequence and are sandwiched as a whole between a metal cathode 1 and a transparent anode 2. The hole transport layer 4 facilitates the infusion of the holes from the anode and blocks electrons. The electron transport layer 5 facilitates the infusion of electrons from the cathode.

In these organic EL devices, a glass substrate 6 is furnished outside the transparent anode 2. The recombination of electrons infused from the metal cathode 1 and the holes infused from the transparent anode 2 to the emitting layer 3 generates excitons. The excitons emit light when they are deactivated through radiation. This light radiates toward outside through the transparent anode 2 and the glass substrate 6.

The conventional organic EL devices constructed as indicated above generally emit light even at a low voltage. However, when the EL device is continuously driven by a DC current, its luminance deterioration probably occurs and then the EL device easily becomes destructible. In addition, such a device is generally inferior in the heat resistance.

SUMMARY OF THE INVENTION

An object of the present invention is to provide an organic EL device with a high heat resistance capable of stably emitting light at a high luminance and a high efficiency for a long time to overcome the above mentioned problem.

An organic EL device according to the present invention comprises a cathode, an emitting layer of organic compound, a hole transport layer of organic compound and an anode which are laminated in sequence, wherein said hole transport layer is made of a triphenylbenzene derivative represented by the following formula (1):

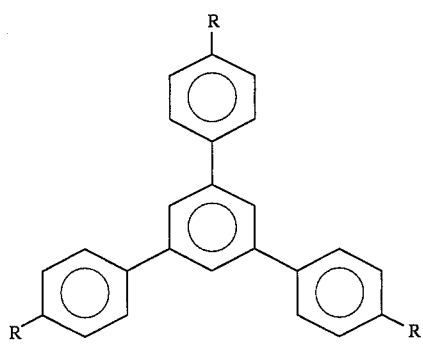

where R each independently represents one of functional groups represented by (Ra), (Rb) and (Rc):

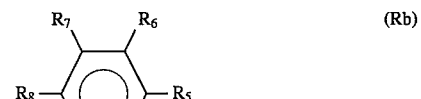

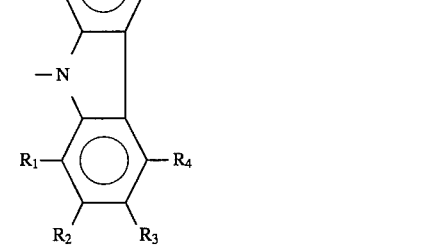

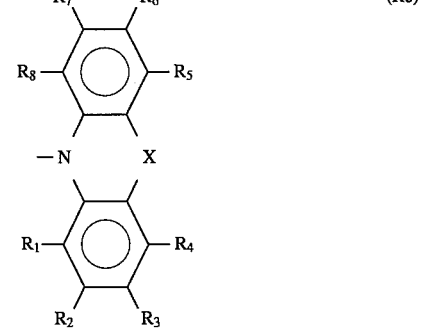

where $R_1$–$R_8$ denote independently a hydrogen atom, an alkyl group, an aryl group, an alkoxy group, art acyl group or an aralkyl group, and X denotes an oxygen atom, a sulfur atom or a selenium atom.

According to the present invention, there is obtained an organic EL device with a high heat resistance capable of stably emitting light at a high luminance and a high efficiency with the durability.

DETAILED DESCRIPTION OF PREFERRED EMBODIMENTS

The embodiments according to the present invention will be described in more detail with reference to the accompanying drawings. The present invention is not restricted within these embodiments and they may be deformed in the spirit of the invention.

Figure 1:
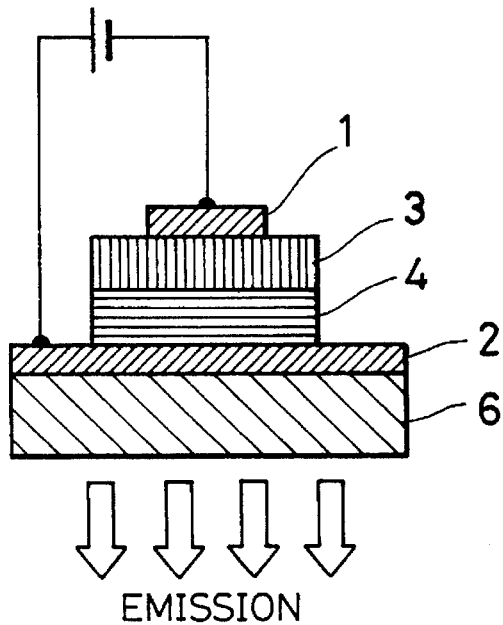
FIG. 1 is a schematic diagram showing an organic EL device with two-layer structure.
Figure 2:
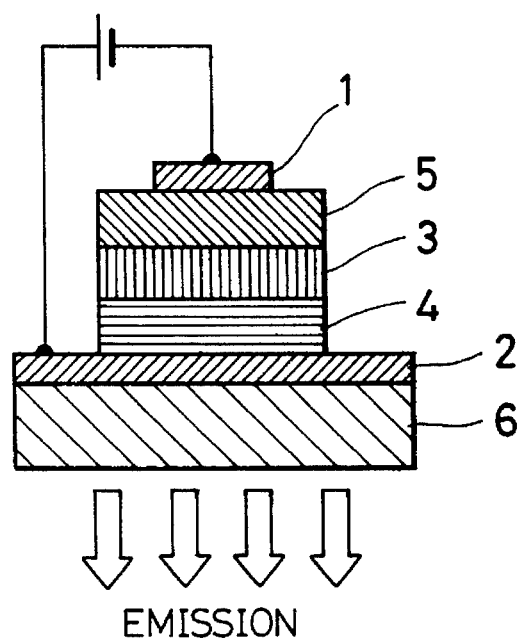
FIG. 2 is a schematic diagram showing an organic EL device with tree-layer structure.

The EL device in accordance with the present invention is similar to the organic EL device of the structure shown in FIG. 1 or 2. Such an EL device may have the two-layer structure formed by layering a fluorescent emission layer 3 and a positive-hole transport layer 4 between a pair of a metal cathode 1 and a transparent anode 2 as shown FIG. 1. The EL device also may have the three-layer structure formed by layering an organic electron transport layer 5, the organic fluorescent film 3 and the organic positive-hole transport layer 4 in sequence between a pair of the metal cathode 1 and the transparent anode 2. In the both structures of the EL device, at least one of the electrodes 1 and 2 may be transparent. The cathode 1 is formed of a metal with a lower work function such as aluminum, magnesium, indium, silver or alloys of the individual metals thereof in the thickness range of from about 100 to 5000 angstroms. The transparent anode 2 is formed of an electric conductive material with a higher work function such as indium-tin oxide (ITO) in the thickness range of from about 1000 to 3000 angstroms. Alternatively, the transparent anode 2 may be formed of gold with the thickness of from about 800 to 1500 angstroms. The electrode of gold thin film is semi-transparent.

The hole transport layer 4 is made of the triphenylbenzene derivative represented by the above mentioned formula (1).

Preferred examples of the triphenylbenzene derivative include 1,3, 5-tris[4-(3-metylphenylphenylamino)phenyl] benzene (hereinafter referred as "m-MTDAPB") denoted by the following formula (2):

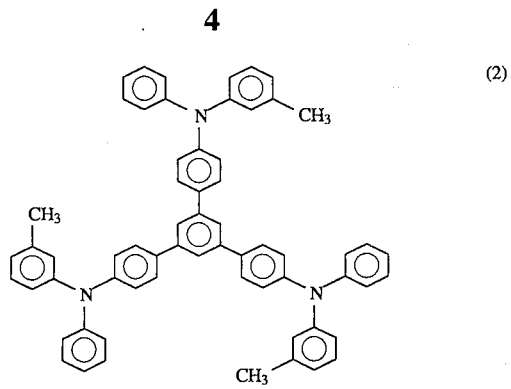

(2)

Inventors have produced so-called star-burst molecules which have a stellar structure, e.g. 4,4',4"-tris(N,N-diphenylamino)triphenylamine (hereinafter referred as "TDATA") and 4,4',4"-tris[N-(3-methylphenyl)-N-phenylamino]triphenylamine (hereinafter referred as "MTDATA") in order to obtain an amorphous molecular material having a photoelectric function. Inventors have studied the morphological changes, electric properties and photoelectric characteristics with respect to these star-burst molecules.

Thus, Inventors have further synthesized m-MTDAPB which are pi electron conjugate star-burst molecules by replacing the triphenylamine central structure with the triphenylbenzene central structure in these star-burst molecules, in order to produce a new material having a high glass transition temperature (Tg). As a result of the studying of their various properties, Inventors revealed that each of m-MTDAPB of star-burst molecules has a high glass transition point and a high molecular stiffness.

Furthermore, the triphenylbenzene derivatives of formula (1) suitable for the hole transport layer 4 include 1,3,5-tris [4-(N-carbazolyl)phenyl]benzene (hereinafter referred as "TCPB") represented by the following formula (3):

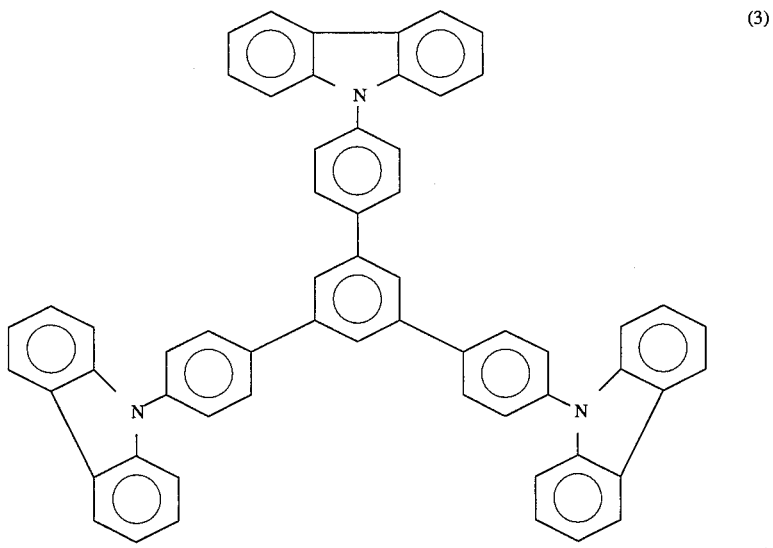

(3)

and, 1,3,5-tris[4-(N-phenothiazinyl)]benzene (hereinafter referred as "TPTPB") represented by the following formula (4):

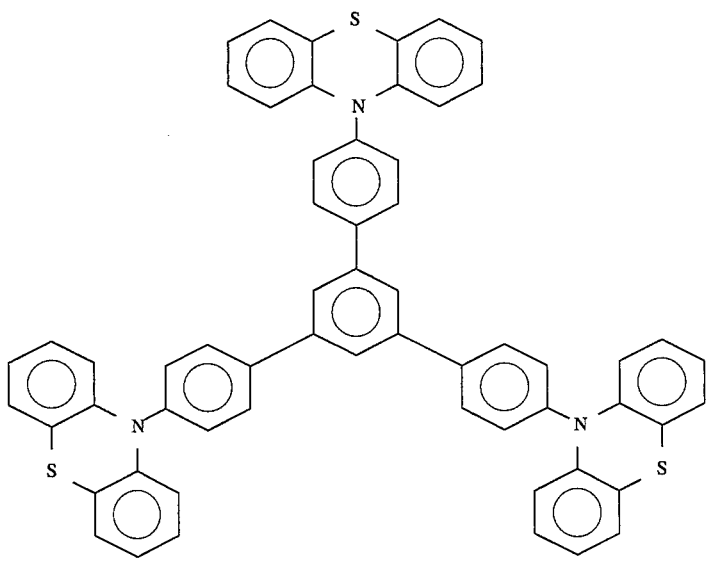

m-MTDAPB was synthesized from 1,3,5-tris(4-iodophenyl)benzene and 3-metylphenylphenylamino through the Ullmann reaction.

TCPB was synthesized from 1,3,5-tris(4-iodophenyl]benzene and carbazole through the Ullmann reaction.

TPTPB was synthesized from 1,3,5-tris(4-iodophenyl] benzene and phenothiazine through the Ullmann reaction.

The identification for each triphenylbenzene derivative is conducted by the various spectrum and ultimate analyses.

The synthesized triphenylbenzene derivative were heated and melted to be an isotropic solution and then allowed to cool for a time undisturbed and to become transparent glass, respectively. This glass was allowed to stand for one year at a room temperature to be stably maintained the glass phase per se.

In the differential scanning calorimetry (DSC) of m-MTDAPB sample, the glass transition phenomenon from the glass phase to the super-cooled phase was observed at 105 centigrade temperature and after that, the exothermic peak of 167 centigrade temperature due to the crystallization thereof and then the endothermic peak of 231 centigrade temperature due to melting were measured while being raised continuously the temperature.

Table 1 shows the glass transition temperatures of MTDATA having the triphenylamine central structure and m-MTDAPB having the triphenylbenzene central structure in which the glass transition temperature of m-MTDAPB is higher than that of MTDATA.

TABLE 1

| Samples | MTDATA | m-MTDAPB |
|---|---|---|
| Glass transition point Tg (centigrade temperature) | 75 | 105 |

This result shows that the glass transition point of the star-burst molecule can be controlled by the replacing of the central structure in the star-burst molecule.

The triphenylbenzene derivative such as m-MTDAPB have heat-resistant properties of high melting points and high glass transition points in the amorphous states respectively. Also, each triphenylbenzene derivative has a twisted molecular structure and three dimensional frameworks. Thus, these triphenylbenzene derivatives of star-burst molecule are hardly crystallized and have excellent shielding properties against a surface of another substance. Even when a thin film made of one of such triphenylbenzene derivatives is left at the temperature lower than room temperature for several months, it is not crystallized. Therefore each triphenylbenzene derivative film in an amorphous maintains its excellent thin film forming property. These triphenylbenzene derivative are capable of being used as the transport layer materials desirable for forming emitting layer 3 thereon.

In addition, other preferable examples of the triphenylbenzene derivatives suitable for the transport layer are 1,3,5-tris[4-(diphenylamino)phenyl]benzene represented by the following formula (5):

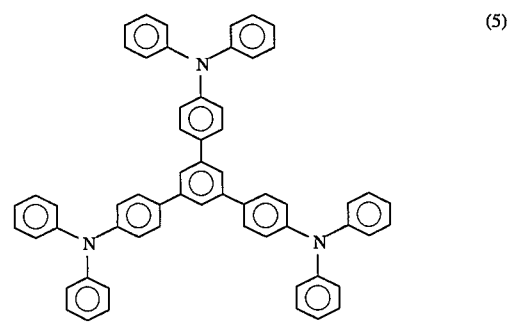

and 1,3,5-tris[4-(N-phenoxazinyl) phenyl]benzene represented by the following formula (6):

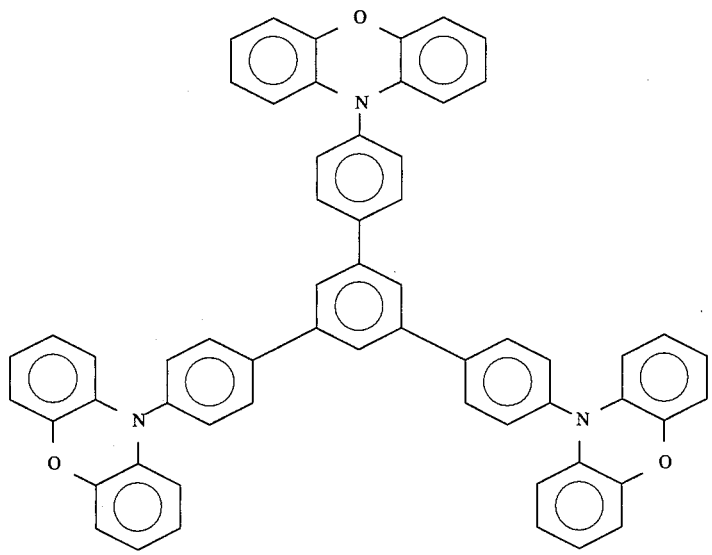
(6)

The hole transport layer in the present invention is not restricted within these examples of the triphenylbenzene derivative mentioned above.

The emitting layer 3 of the organic EL device comprises the organic fluorescent compound. Preferred examples of the compound are Aluminum oxine chelate (hereinafter referred as "$Al_{q3}$") denoted by the following formula (7) and, tetraphenylbutadiene (hereinafter referred as "TPB") derivatives respectively represented by the following formulas (8) to (10), which may include another fluorescent compound as a guest material. The thickness of the emitting layer 3 is within 1 micron meter or less. In addition, other preferred examples used for the emitting layer 3 are represented by the following formulas (11) to (15):

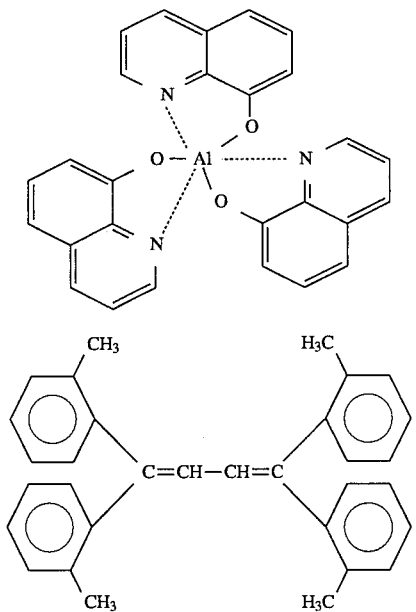
(7)

(8)

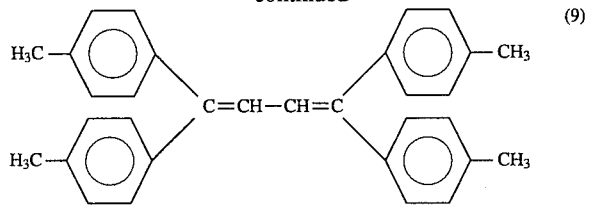
(9)

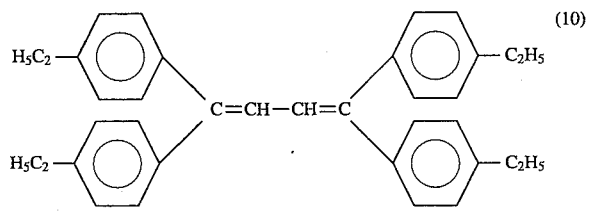
(10)

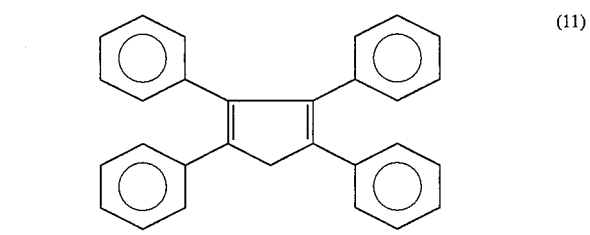
(11)

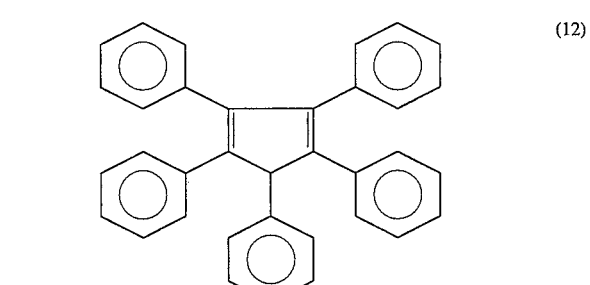
(12)

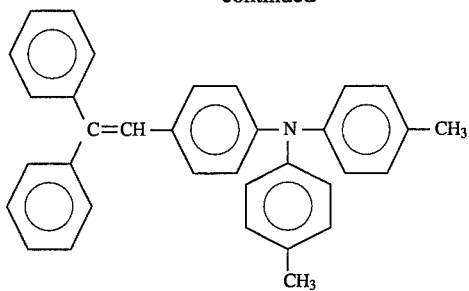
(13)

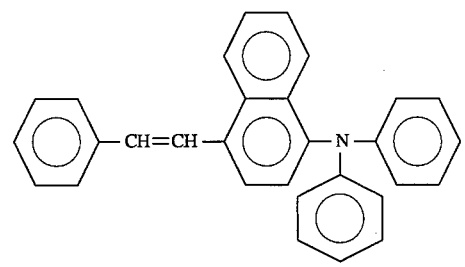
(14)

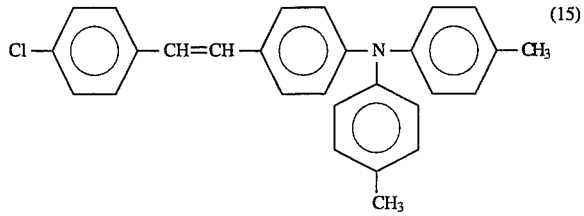
(15)

In case that the organic EL device has the three-layer structure as shown in FIG. 2, the electron transport layer 5 is preferably made of so-called Bu-PBD which is 2-(4'-tert-butylphenyl)-5-(biphenyl)-1,3,4-oxadiazole represented by the following formula (16). Examples of suitable organic compounds which may be employed as the electron transport layer 5 are represented by the following formulas (17) to (23).

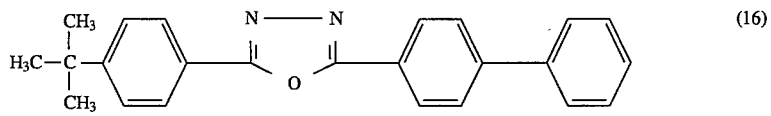
(16)

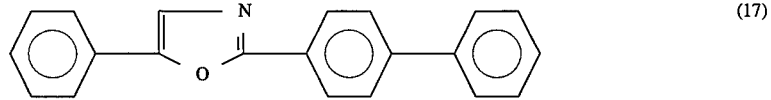
(17)

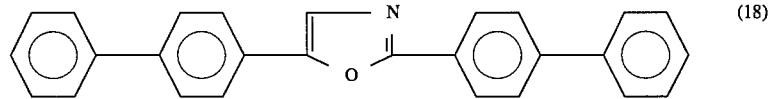
(18)

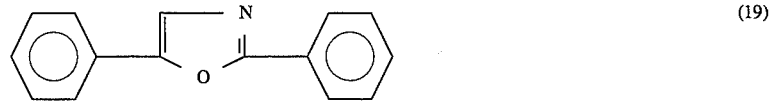
(19)

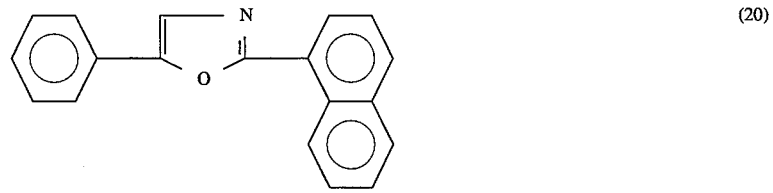
(20)

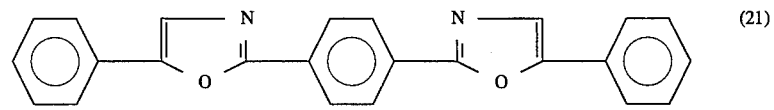
(21)

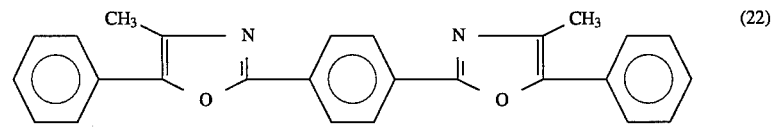
(22)

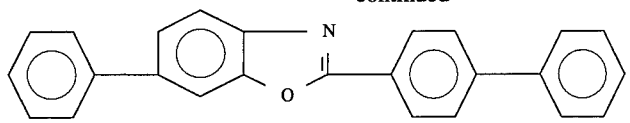

EXAMPLE 1

A glass substrate on which an anode of ITO had been formed at 2000 angstroms thick, was prepared. First, m-MTDAPB of formula (1) was deposited on the ITO anode with the thickness of 500 angstroms as a hole transport layer at the vacuum deposition rate of 4 angstroms/sec. Next, $Al_{q3}$ of formula (5) was deposited on the hole transport layer as an emitting layer with the thickness of 500 angstroms at the vacuum deposition rate of 5 angstroms/sec. Then, magnesium and silver were vacuum co-deposited on the emitting layer of $Al_{q3}$ with the thickness of 1500 angstroms at the atomic ratio of Mg:Ag=10:1 as a cathode. Each of these thin films was formed by a vacuum deposition method at vacuum conditions equal to or less than $1.0 \times 10^{-5}$ Torr.

When the resultant EL device as shown in FIG. 1 was operated with the application of the DC voltage 8 V at the constant current density of 6.3 mA/cm$^2$, the emission of this EL device was luminance of 284 cd/m$^2$. Upon application of the DC voltage at the constant current density of 7 mA/cm$^2$, the half-life of the initial luminance of this EL device was 313 hours under a vacuum state.

There was hardly changed in the current and luminance property before and after the heat-resistance test in which the EL device of example 1 was stored at the temperature of 90 for 72 hours under a vacuum state.

EXAMPLE 2

Figure 3:
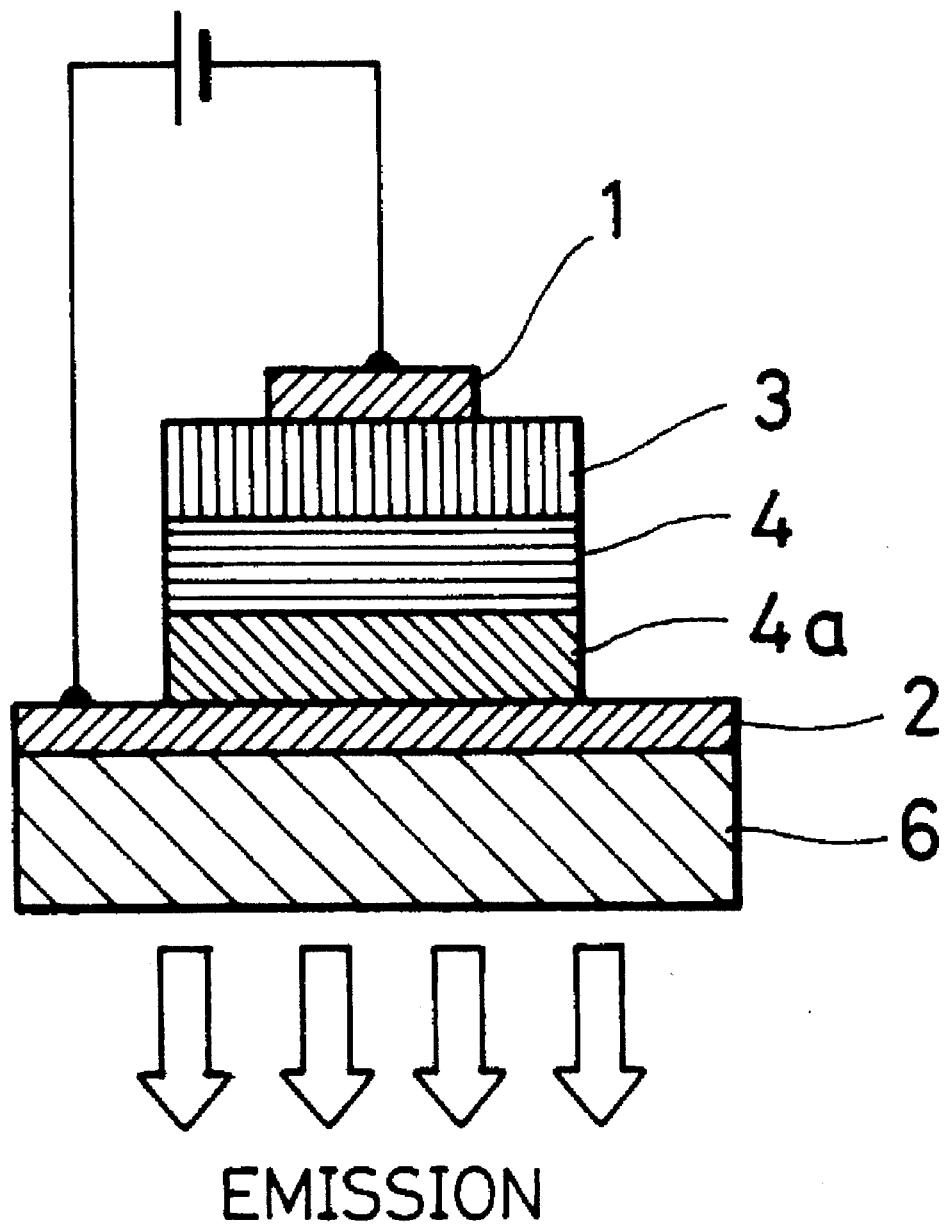
FIG. 3 is a schematic diagram showing an organic EL device shown in Example 2 in accordance with the present invention.

An EL device was assembled by the same procedure as in the Example 1, except that ,as shown in FIG. 3, a second transport layer 4a made of the above MTDATA with 500 angstroms thick is formed between the ITO anode 2 and the m-MTDAPB hole transport layer 4 and the m-MTDAPB layer is formed at 120 angstroms thick.

When the resultant EL device was operated with the application of the DC voltage 8 V at the constant current density of 6.3 mA/cm$^2$ the emission of this EL device was luminance of 411 cd/m$^2$. Upon application of the DC voltage at the constant current density of 5.3 mA/cm$^2$, the half-life of the initial luminance of this EL device was 540 hours under a vacuum state.

There was hardly changed in the current and luminance property before and after the heat-resistance test in which the EL device of example 2 was stored at the temperature of 90 for 72 hours under a vacuum state.

In this way, this example EL device having a multilayer of the first m-MTDAPB and the second MTDATA hole transport layer, has a luminance efficiency higher than that of the example 1 and its long-life luminance is improved.

Comparative example

An EL device was assembled by the same procedure as in the Example 1, except that the transport layer was made of N,N'-diphenyl-N-N'-bis(3-methylphenyl)-1,1'-biphenyl-4,4'-diamine (so-called "TPD") represented by the following formula (24) instead of m-MTDAPB of transporting material used in the Example 1.

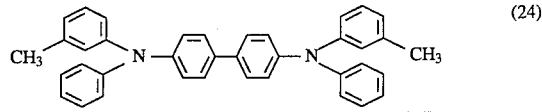

When the resultant EL device was operated with the application of the DC voltage 6 V at the constant current density of 6.3 mA/cm$^2$, the emission of this EL device was luminance of 258 cd/m$^2$. Upon application of the DC voltage at the constant current density of 7.5 Ma/cm$^2$ the half-life of the initial luminance of this EL device was 131 hours under a vacuum state.

This comparative EL device was compared with that of example 1 in the same heat-resistance test in which these EL devices were left at 90 centigrade temperature for 72 hours. As a result of measurement of the current and luminance property between before and after, the deterioration of luminance of the comparative EL devices was rapid in comparison with Examples mentioned above.

In addition, there are provided with three or more hole transport layers in the EL device.

As described above, the organic EL device according to the present invention comprises the organic emitting layer and the first organic hole transport layer laminated with each other and arranged between the cathode and the anode, in characterized in that the hole transport layer made of the triphenylbenzene derivative. The hole transport layer of the triphenylbenzene derivative has a high heart-resistant property. Thus, the hole transport layer of the triphenylbenzene derivative reduces the undesirable influence thereon caused by the heat generated from application of electric current.

In this way, it is possible according to the present invention to improve the durability of the organic EL device which emits light at a high luminance and a high efficiency upon application of a low voltage.

What is claimed is:

1. An organic electroluminescent device comprising a cathode, an emitting layer of organic compound, a hole transport layer of organic compound and an anode which are laminated in sequence, wherein said hole transport layer is made of a triphenylbenzene derivative represented by the following formula (1):

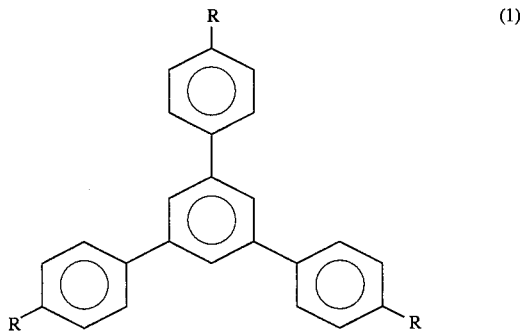

where R each independently represents one of functional groups represented by (Ra), (Rb) and (Rc):

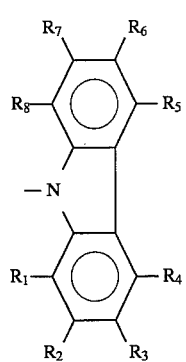
(Ra)

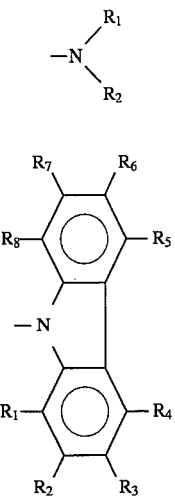
(Rb)

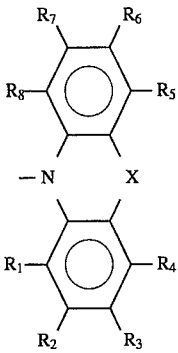
(Rc)

where $R_1$–$R_8$ denote independently a hydrogen atom, an alkyl group, an aryl group, an alkoxy group, an acyl group or an aralkyl group, and X denotes an oxygen atom, a sulfur atom or a selenium atom.

2. An organic electroluminescent device according to claim 1, wherein an organic electron transport layer is provided between said cathode and said emitting layer.

* * * * *